(12) United States Patent
Taki et al.

(10) Patent No.: US 7,015,515 B2
(45) Date of Patent: Mar. 21, 2006

(54) GROUP III NITRIDE COMPOUND SEMICONDUCTOR DEVICE HAVING A SUPERLATTICE STRUCTURE

(75) Inventors: Tetsuya Taki, Nishikasugai-gun (JP); Makoto Asai, Nishikasugai-gun (JP); Katsuhisa Sawazaki, Nishikasugai-gun (JP); Naoki Kaneyama, Nishikasugal-gun (JP); Toshiya Uemura, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 53 days.

(21) Appl. No.: 10/163,335

(22) Filed: Jun. 7, 2002

(65) Prior Publication Data

US 2002/0197827 A1     Dec. 26, 2002

(30) Foreign Application Priority Data

Jun. 8, 2001   (JP) .............................. 2001-174918
Apr. 23, 2002  (JP) .............................. 2002-120270

(51) Int. Cl.
    *H01L 29/15*     (2006.01)
(52) U.S. Cl. ................. 257/103; 257/615; 257/E33.028
(58) Field of Classification Search .................. 257/97, 257/103, 201, 615, E33.028
    See application file for complete search history.

(56) References Cited

U.S. PATENT DOCUMENTS 5,831,277 A * 11/1998 Razeghi ..................... 257/15
6,104,039 A *  8/2000 Asatsuma et al. ............ 257/22
6,153,894 A * 11/2000 Udagawa ..................... 257/96
6,521,917 B1 * 2/2003 Takayama et al. .......... 257/103
6,617,060 B1 * 9/2003 Weeks et al. ................ 428/698

FOREIGN PATENT DOCUMENTS

| EP | 1063711 A1 * | 12/2000 |
| JP | 09-232629 A | 9/1997 |
| JP | 2000-012979 A | 1/2000 |
| JP | 2001097800 A * | 4/2001 |
| WO | WO99/46822 | 9/1999 |

OTHER PUBLICATIONS

T. Kachi, "Manufacturing Method of Group-III Nitride Semiconductor, Manufacturing Method of Group-III Nitride Semiconductor Luminous Element, and Group-III Nitride Semiconductor Luminous Element," Translation of JP2001-97800-A, Apr. 2001, JPO, 31 pages.*

K. Kumakura et al., "Increased Electrical Activity of Mg-Acceptors in Alx Gai-x N/GaN Superlattices," Jpn. J. Appl. Phys., vol. 38, Part 2, No. 9A/B, Sep. 1999, pp. L1012-L1014.

* cited by examiner

*Primary Examiner*—Stephen W. Smoot
(74) *Attorney, Agent, or Firm*—McGinn IP Law Group, PLLC

(57) ABSTRACT

After one of layers constituting a superlattice structure is formed by an MOCVD method, $NH_3$ gas is circulated together with $H_2$ gas as a carrier gas to thereby perform a purge step. After the purge step, a next layer is formed.

22 Claims, 6 Drawing Sheets

CHANGE OF THICKNESS OF EACH LAYER IN AlGaN/AlGaN: In COMPARISON IN LAYER THICKNESS (AlGaN = AlGaN: In = L)

GROUP III NITRIDE COMPOUND SEMICONDUCTOR DEVICE HAVING A SUPERLATTICE STRUCTURE

The present application is based on Japanese Patent Applications Nos. 2001-174910 and 2002 120270, which are incorporated herein by reference.

BACKGROUND OF THE INVENTION

1. Field of the Invention

The present invention relates to a Group III nitride compound semiconductor device. For example, the invention is adapted for improvement of a p-type layer in a Group III nitride compound semiconductor device such an a blue light-emitting diode.

2. Description of the Related Art

A Group III nitride compound semiconductor device having a p-type layer of a multi-layered structure has been heretofore proposed. For example, a p-type layer of a superlattice structure constituted by an alternate laminate of AlGaN and GaN has been disclosed in K. Kumakura and N. Kobayashi; Jpn J Appl. Phys. 38(1999) L1012.

When the p-type layer wag formed to have a superlattice structure in this manner, the electric resistance of the p-type layer itself was reduced. Greater improvement in electrical characteristic of the p-type layer has been, however, required of recent devices.

SUMMARY OF THE INVENTION

The present inventors have paid attention to such a p-type layer having a superlattice structure and made eager examination to improve more greatly electrical characteristic of the p type layer. As a result, it has been found that the following production method is effective in reducing the resistance of the p-type layer. That is, the configuration of the invention is as follows.

A method of producing a Group III nitride compound semiconductor device having a p-type layer of a superlattice structure, including the purge step of stopping supply of a Group III material gas while sustaining supply of a Group V material gas when each of layers in the superlattice structure is grown by an MOCVD method.

Figure 1:
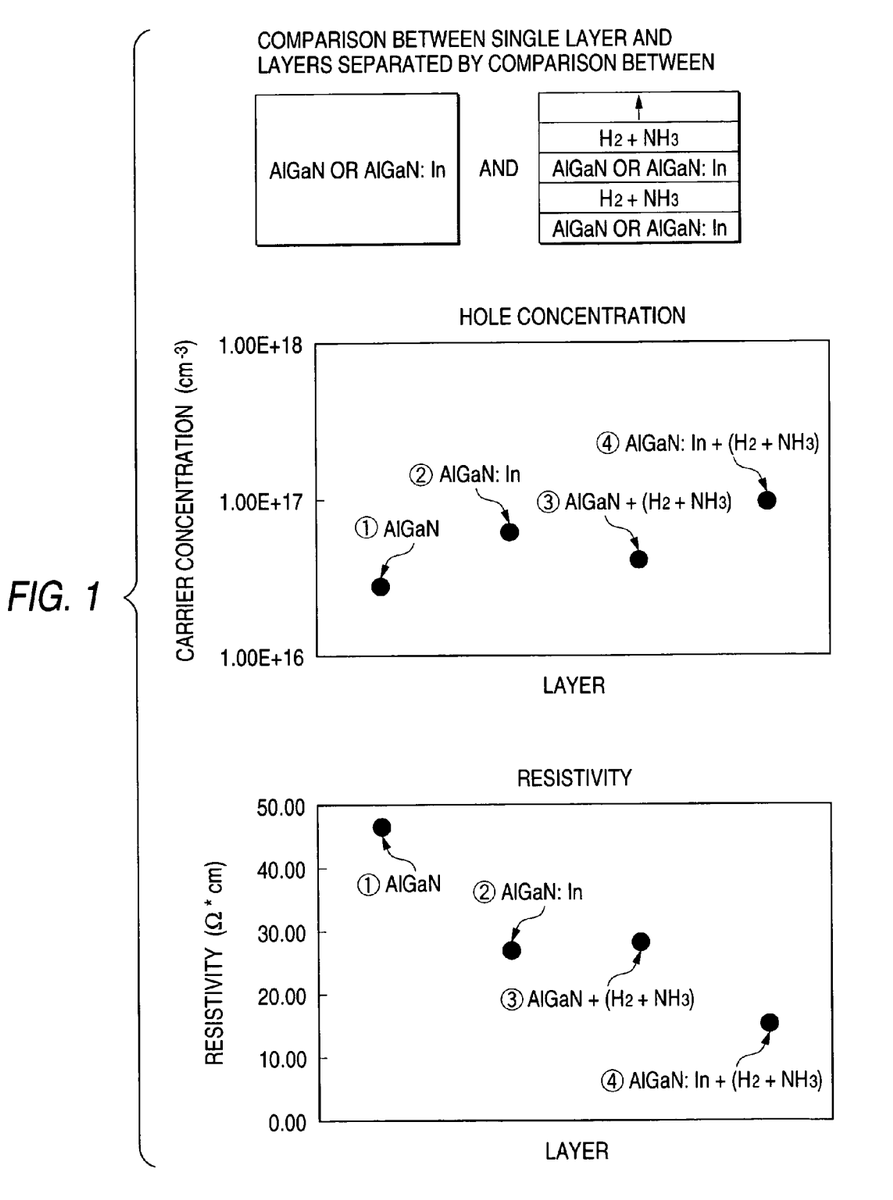
FIG. 1 is a graph showing carrier concentration and resistivity in Test Examples 1 to 4.

When the growth of one of layers in the superlattice structure is separated from that of another layer by the purge step, the resistance of the p-type layer is reduced (see FIG. 1). When the composition of each of the layers in the superlattice structure is determined suitably, the resistance of the p-type layer is reduced more greatly. Particularly when each of the layers included in the superlattice structure and made of AlGaN is doped with In, the resistance of the p-type layer is reduced more greatly, and when the superlattice structure is formed so that alternate layers are doped with In, the resistance of the p-type layer is reduced further more greatly (see FIG. 2). It is obvious that adjustment of the dope amount of In (see FIG. 3) and adjustment of the thickness of each layer (FIG. 4) have an influence on reduction in the resistance of the p-type layer.

Features and advantage of the invention will be evident from the following detailed description of the preferred embodiments described in conjunction with the attached drawings.

DETAILED DESCRIPTION OF THE PREFERRED EMBODIMENTS

The invention will be described more in detail in connection with the following test examples.

(1) Test Example 1: AlGaN single layer
This layer is 1,000 nm thick.

(2) Test Example 2: AlGaN:In single layer
This layer is 1,000 nm thick, The dope amount of In is TMI/(TMI+TMG+TMA)=0.16 in terms of gas phase ratio and in a rang of from $10^{16}$ to $10^{22}/cm^3$ in terms of solid phase ratio.

(3) Test Example 3: Superlattice Structure of AlGaN/AlGaN
Each layer is 8 nm thick. The iteration number is 120.
After one layer is formed, $H_2$ gas and $NH_3$ gas are made to flow onto a surface of the layer. The flow rate of the $H_2$ gas is 23 slm wherein the flow rate of the $NH_3$ gas is 10 slm. The flow time is 2 seconds.

(4) Test Example 4: Superlattice Structure of AlGaN:In/AlGaN:In
Each of the layers in the Test Example 3 is doped with a small amount of In as a Group III element. The dope amount of In is 0.16 in terms of gas phase ratio and in a range of from $10^{16}$ to $10^{23}/cm^3$ in terms of solid phase ratio.

As a result of FIG. 1, it is obvious from comparison between Test Examples (1) and (2) that resistivity is reduced when a single layer is doped with In. It is further confirmed that the same low resistivity as that of a single layer doped with In (Test Example (2)) can be obtained even in a single composition of AlGaN (Test Example (3)) when the purge step using $H_2$ gas and $NH_3$ gas is executed. When layers doped with In are separated from one other by the purge step, the resistivity of the structure is reduced more greatly (see Test Example (4)).

The semiconductor layer in each Test Example is formed on non-doped GaN (2 $\mu$m) by an MOCVD method.

The purge step can be substantially executed by stopping supply of a Group III material gas when a Group III nitride compound semiconductor layer is grown by an MOCVD method. $H_2$ gas is preferably used as a carrier gas.

The reason why the resistivity of the semiconductor layer is reduced by interposition of the purge step can be conceived as follows. Supply of a Group V material gas ($NH_3$ gas) can prevent the Group V element from being absent in semiconductor crystal.

In the purge step, the mixture ratio of $H_2$ gas to $NH_3$ gas is not particularly limited. From the point of view of facilitating management of production steps, it is preferable that the same mixture ratio as that used for growing the semiconductor layer is used in the purge step.

The time required for executing the purge step is not particularly limited but preferably selected to be in a range of from 1 to 20 seconds, especially in a range of from 1 to 5 seconds.

It is conceivable that reduction of resistivity by the purge step will be obtained also in another Group III nitride compound semiconductor.

In this specification, the Group III nitride compound semiconductors are represented by the general formula $Al_XGa_YIn_{1-X-Y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_XGa_{1-X}N$, $Al_XIn_{1-X}N$ and $Ga_XIn_{1-X}N$ ($0<X<1$). The group III elements may be partially replaced by boron (B), thallium (Tl) etc. The nitrogen (N) may be partially replaced by phosphorus (P), arsenic (As), antimony (Sb), bismuth (Bi), etc. Each of the Group III nitride compound semiconductors may contain any optional dopant. Si, Ge, Se,, Te, C, etc. may be used as n-type impurities. Mg, Zn, Bc, Ca, Sr, Ba, etc. may be used as p-type impurities. Incidentally, after doped with p-type impurities, the Group III nitride compound semiconductor may be subjected to electron beam irradiation, plasma irradiation or heating in a furnace. This step is not always essential.

Also in the case where each layer is formed by a metal organic chemical vapor deposition method (MOCVD method), a halide vapor phase epitaxy method (HVPE method), or the like, it is conceivable that the low resistivity effect can be obtained by execution of the purge step.

Incidentally, in this specification, examples of the Group III nitride compound semiconductor device include: optical devices such as a light-emitting diode, a light receiving diode, a laser diode, and a solar cell; bipolar devices such as a rectifier, a thyristor, and a transistor; unipolar devices such as an FET; and electronic devices such as a microwave device. In addition, the invention may be applied also to laminates which are intermediate products of these devices.

Incidentally, a homostructure or a single or double heterostructure provided with an MIS junction, a PIN junction or a p-n junction can be used as the structure of the light-emitting device. A layer containing a quantum well structure (single quantum well structure or multiple quantum well structure) may be also used.

Although Test examples (3) and (4) have been described upon the case where all AlGaN layers are equal in composition, the invention may be applied also to the case where an iteration structure of $Al_xGa_{1-x}N/Al_yGa_{1-y}N$ ($x \neq y$) is used.

Figure 2:
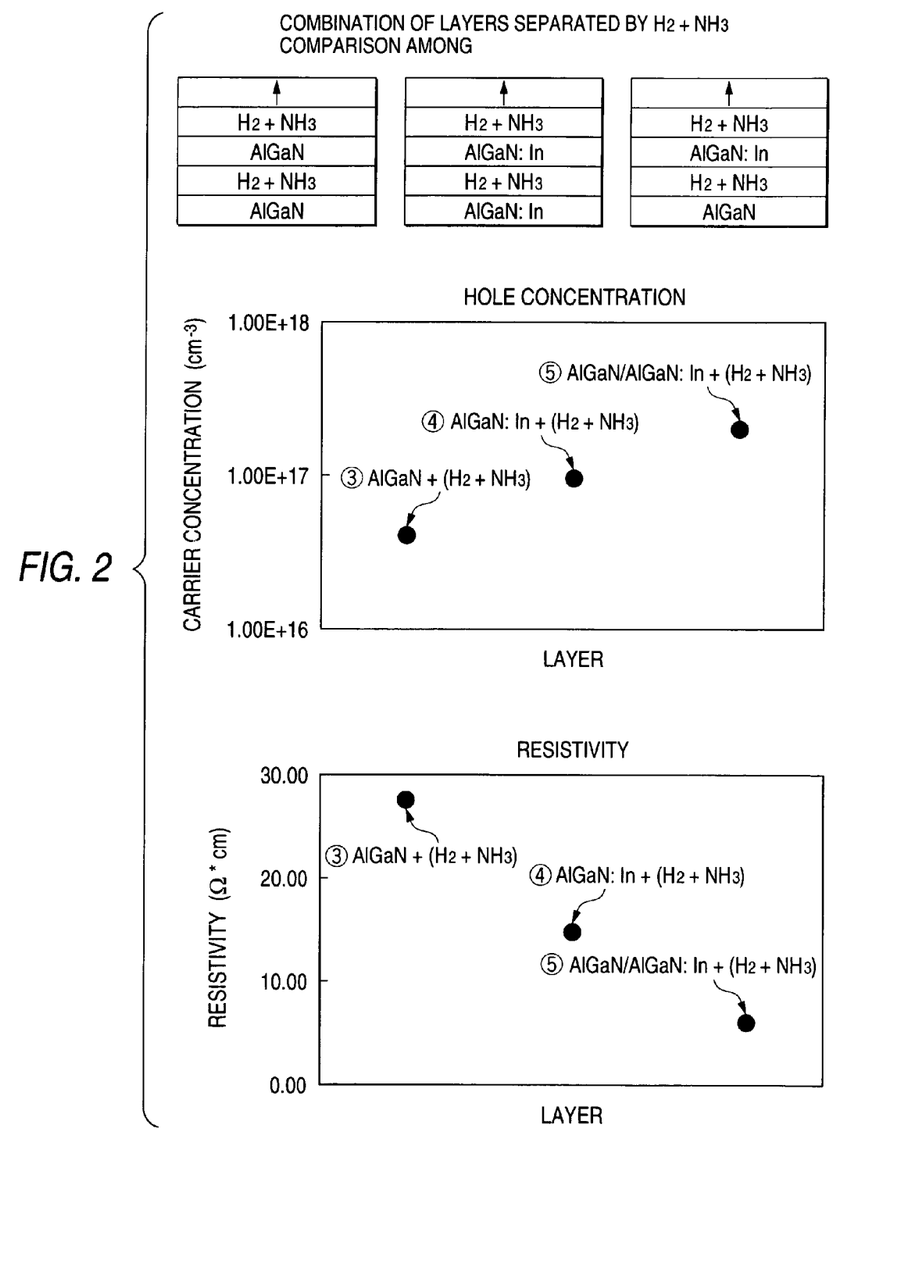
FIG. 2 is a graph showing carrier concentration and resistivity in Test Examples 3 to 5.

FIG. 2 shows Test Example 5.

(5) Test Example 5: Superlattice Structure of AlGaN/AlGaN:In

The semiconductor layers of Test Example 5 are configured so that one group of layers in Test Example 4 are doped with In. The dope amount of In is equal to that in Test Example 4.

It can be confirmed from a result of Test Example 5 that resistivity is reduced more greatly when one group of layers in the iteration structure are doped with In.

Figure 3:
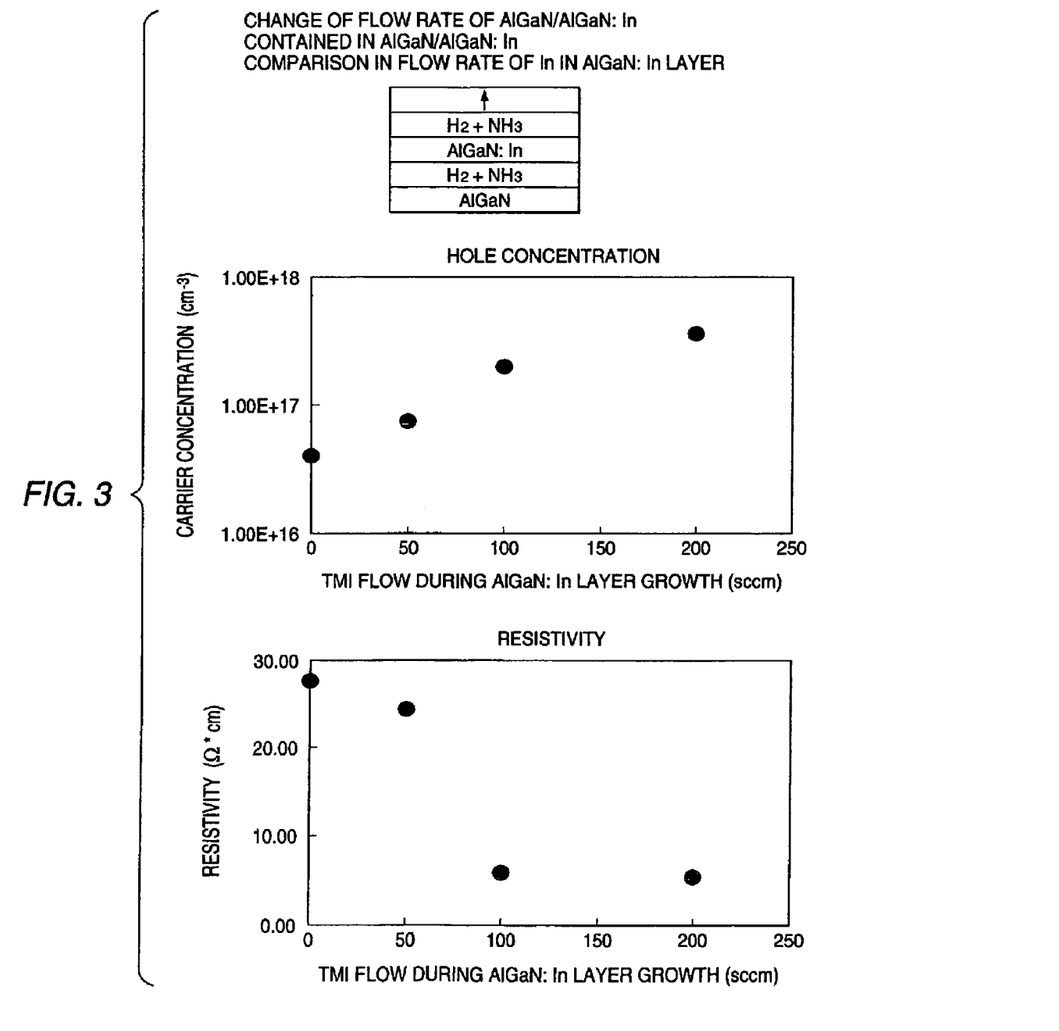
FIG. 3 is a graph showing the changes of carrier concentration and resistivity when the flow rate of In is changed in Test Example 5.

Referring to FIG. 3, the relation between the dope amount of In and resistivity is examined as follows.

When the dope amount of In is changed in the configuration of Test Example 5, resistivity begins to be reduced rapidly after the flow rate of TMI (trimethyl indium) as a material gas of In exceeds 50 sccm. When the flow rate of TMI is 50 sccm, Group III material gases (TMG, TMA and TMI) contain 9% by volume of TMI (In material gas). Accordingly, the amount of TMI contained in Group III material gases is preferably selected to be not smaller than 9% by volume, more preferably not smaller than 16% by volume, further preferably than 25% by volume. The upper limit of the flow rate of TMI is not particularly limited but preferably selected to be 500 sccm.

In other words, the amount of In to be added into each of layers constituting the superlattice structure is preferably selected to be not smaller than $10^{16}/cm^3$, more preferably not smaller than $10^{17}/cm^3$, further preferably not smaller than $10^{18}/cm^3$. The upper limit of the composition ratio of In is not particularly limited but preferably selected to be not smaller than $10^{22}/cm^3$, more preferably not smaller than $10^{23}/cm^3$.

Although the amount of In contained in the structure (AlGaN/AlGaN:In) or Test Example 5 has been examined with reference to FIG. 3, it is conceivable that the amount of In obtained in FIG. 3 can be applied also to Test Example 2 (AlGaN:In single layer) and Test Example 4 (AlGaN:In/AlGaN:In).

Further, deductively, it is conceivable that the relation of the amount of In to be contained can be applied to the cases of GaN:In single layer, $Al_xGa_{1-x}N:In/Al_yGa_{1-y}N:In$ ($0 \leq x$, $y \leq 1$) and $Al_xGa_{1-x}N/Al_yGa_{1-y}N:In$ ($0 \leq x$, $y \leq 1$).

Figure 4:
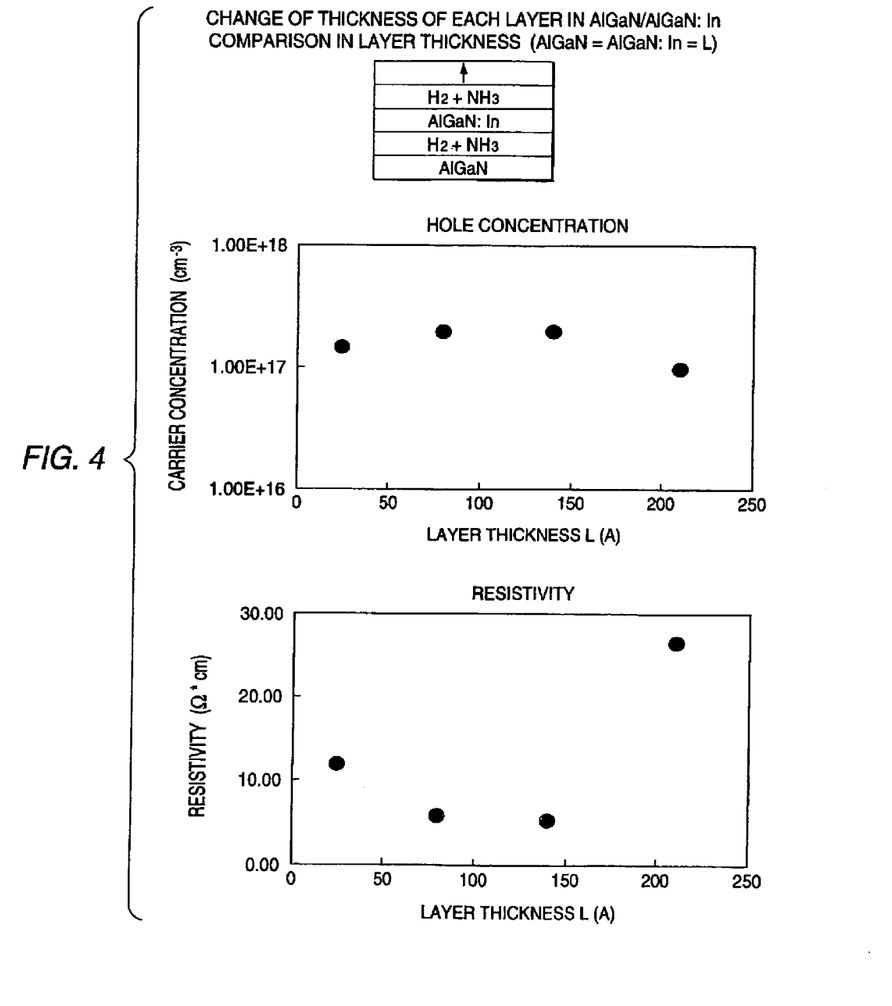
FIG. 4 is a graph showing the changes of carrier concentration and resistivity when the thickness of each layer is changed in Text Example 5.

Referring to FIG. 4, the relation between the thickness of each of layers constituting the superlattice structure and resistivity is more preferably examined as follows.

When the thickness of each layer is changed in the configuration of Test Example 5, it is found that resistivity is increased after the layer thickness exceeds 15 nm. From this result, the layer thickness is preferably selected to not larger than 18 nm, more preferably in a range of from 5 to 15 nm.

Although each of the layers in the structure (AlGaN/AlGaN:In) of Test Example 5 has been examined with reference to the example of FIG. 4, it is conceivable that the relation of the layer thickness obtained in FIG. 4 can be applied also to Test Example 3 (AlGaN/AlGaN) and Test Example 4 (AlGaN:In/AlGaN:In).

Further, deductively, it is conceivable that the relation of the layer thickness can be applied to the cases of $Al_xGa_{1-x}N/Al_yGa_{1-y}N$ ($0 \leq x$, $y \leq 1$) and $Al_xGa_{1-x}N:In/Al_yGa_{1-y}N:In$ ($0 \leq x$, $y \leq 1$) and $Al_xGa_{1-x}N/Al_yGa_{1-y}N:In$ ($0 \leq x$, $y \leq 1$).

Although the above Test Examples have been described upon the case where p-type impurities such as Mg are not added, it is conceivable that the same effect as described above can be obtained also in the case where p-type impurities are added.

Embodiment

An embodiment of the invention will be described below.

Figure 5:
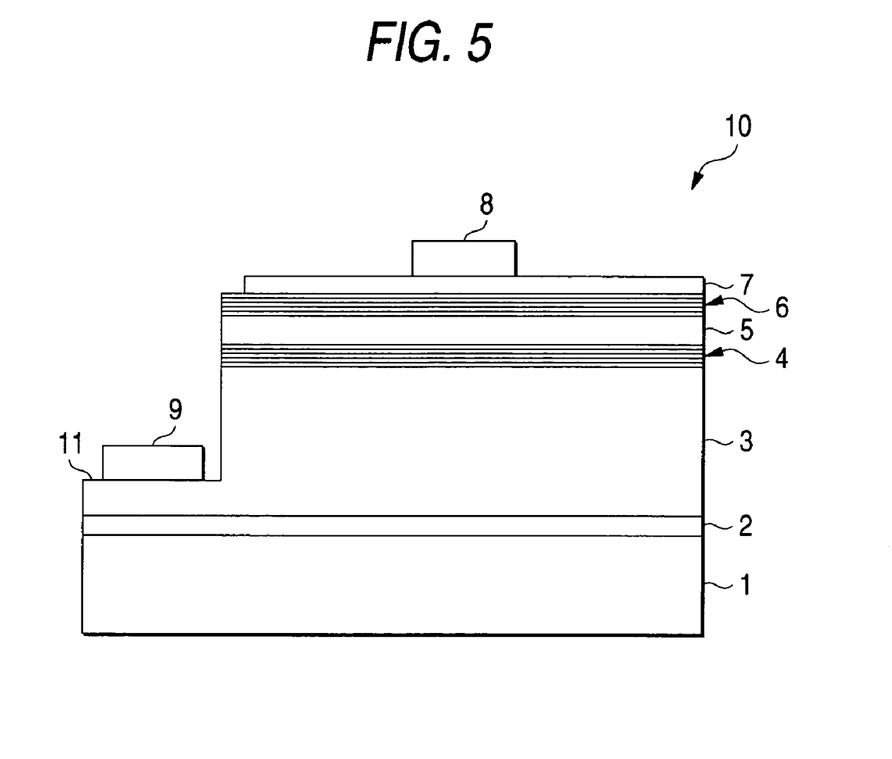
FIG. 5 is a sectional view showing the configuration of a light-emitting diode as an embodiment of the invention.

FIG. 5 shows the configuration of a light-emitting diode 10 as an embodiment of the invention.

| Layer | Composition: Dopant |
|---|---|
| Fourth layer 6 (p-type) | Superlattice structure |
| Second layer | $Al_{0.03}Ga_{0.97}N$: In, Mg |
| First layer | $Al_{0.03}Ga_{0.97}N$: Mg |
| Iteration number of first and second layers: 1 to 10 | |
| Third layer 5 (p-type) | p-$Al_{0.13}Ga_{0.87}N$: Mg |
| Second layer 4 | Superlattice structure |

-continued

| Layer | Composition: Dopant |
|---|---|
| Quantum well layer | $In_{0.15}Ga_{0.85}N$ |
| Barrier layer | GaN |
| Iteration number of quantum well layers and barrier layers: 1 to 10 | |
| First layer 3 (n-type) | n-GaN: Si |
| AlN buffer layer 2 | AlN |
| Substrate 1 | Sapphire (surface a) |

A first layer (n-type layer) 3 of GaN doped with Si as n-type impurities is formed on a substrate 1 through a buffer layer 2. Although sapphire is used as the material of the substrate 1 here, the material of the substrate 1 is not limited thereto. Examples of the material of the substrate 1 which can be used include sapphire, spinel, silicon, silicon carbide, zinc oxide, gallium phosphide, gallium arsenide, magnesium oxide, manganese oxide, and Group III nitride compound semiconductor monocrystal. Although this embodiment also shows the case where the buffer layer 2 is made of AlN by an MOCVD method, the material of the buffer layer 2 in not limited thereto. For example, GaN, InN, AlGaN, InGaN, or AlInGaN may be used as the material of the buffer layer 2. A molecular beam epitaxy method (MBE method), a halide vapor phase epitaxy method (HVPE method), a sputtering method, an ion-plating method, an electron shower method, etc. may be used as the method for producing the buffer layer 2. When Group III nitride compound semiconductor is used as the material of the substrate 1, the buffer layer 2 can be omitted.

The substrate 1 and the buffer layer 2 may be removed in accordance with necessity after the formation of the semiconductor device.

Although this embodiment shows the case where the first layer 3 is made of GaN, the invention maybe applied also to the case where AlGaN, InGaN or AlInGaN is used as the material of the first layer 3.

Although this embodiment shows the case where the material of the n-type layer is doped with Si as n-type impurities, the invention may be applied also to the case where Ge, Se, Te, C, or the like, is used as n-type impurities.

The first layer 3 may be of a double-layer structure with an n⁻ layer of low electron density on the light-emitting layer-containing layer (second layer) 4 side and an n⁺ layer of high electron density on the buffer layer 2 side.

The second layer (light-emitting layer-containing layer) 4 may contain a light-emitting layer of a quantum well structure. The structure of the light-emitting device may be of a single hetero type, a double hetero type or a homo-junction type.

The second layer 4 may contain a Group III nitride compound semiconductor layer provided on the third layer (p-type layer) 5 side, doped with an acceptor such as magnesium and having a wide band gap. This is a technique for effectively preventing electrons imported into the second layer 4, from diffusing into the third layer 5.

The third layer 5 made of GaN doped with Mg as p-type impurities is formed on the second layer 4. The p-type layer may be made of AlGan, InGaN or InAlGaN instead. Zn, Re, Ca, Sr or Ba may be used as p-type impurities instead.

The third layer 5 may be of a double-layer structure with a p⁻ layer of low hole density on the second layer 4 side and a p⁺ layer of high hole density on the electrode side.

In the light-emitting diode configured as described above, each of the Group III nitride compound semiconductor layers may be formed by an MOCVD method in a general condition. $H_2$ is used as a carried gas, and $NH_3$ is used as a Group V material gas. After one of layers constituting the fourth layer 6 is formed, supply of Group III material gases (TMG, TMA and, if necessary, TMI) and a dope gas $(RC_3H_4)_2Mg$ is stopped while $H_2$ gas and $NH_3$ gas are circulated. Such a purge step is executed for 5 seconds. The substrate temperature is not particularly changed, that is, the substrate temperature is kept at about 1,000° C.

Then, a mask in formed and the fourth layer 6, the third layer 5, the second layer 4 and the first layer 3 are partially removed by reactive ion etching to thereby reveal an n-type electrode-forming surface 11 on which the n electrode 9 is to be formed.

Then, a Co layer (1.5 nm) and an Au layer (60 nm) are laminated successively on the whole surface of a water by an evaporator. Then, a photo resist is applied uniformly. The photo resist is removed from a portion (clearance region) about 10 μm wide in the n electrode-forming surface 11 and its vicinity by photolithography. The light-transmissive electrode-forming material is removed from this portion by etching. Thus, the semiconductor layer 5 is revealed. Then, the photo resist is removed.

Then, a V layer (17.5 nm), an Au layer (1.5 μm) and an Al layer (10 nm) are evaporated and laminated successively by a lift-off method to thereby form a p seat electrode-forming layer.

Incidentally, vanadium and aluminum are laminated successively by a lift off method to thereby form an n-type electrode-forming layer in the same manner as described above.

The sample obtained in such a manner is heated in an atmosphere with the presence of oxygen. As a result of the heating, the light-transmissive electrode-forming layer is alloyed to thereby form a light-transmissive electrode 7, the p seat electrode-forming layer is also alloyed to thereby form a p seat electrode 8, and the n electrode-forming layer is alloyed to thereby form an n electrode 9.

COMPARATIVE EXAMPLE

The light-emitting diode shown in FIG. 5 was modified such that the fourth layer 6 (p-type) with superlattice structure was omitted and the third layer 5 (p-type) was grown to be thicker by the thickness of the omitted fourth layer 6 to prepare a light-emitting diode as a comparative example. Thus, the p-type layer in the comparative example has a single layer structure.

Figure 6:
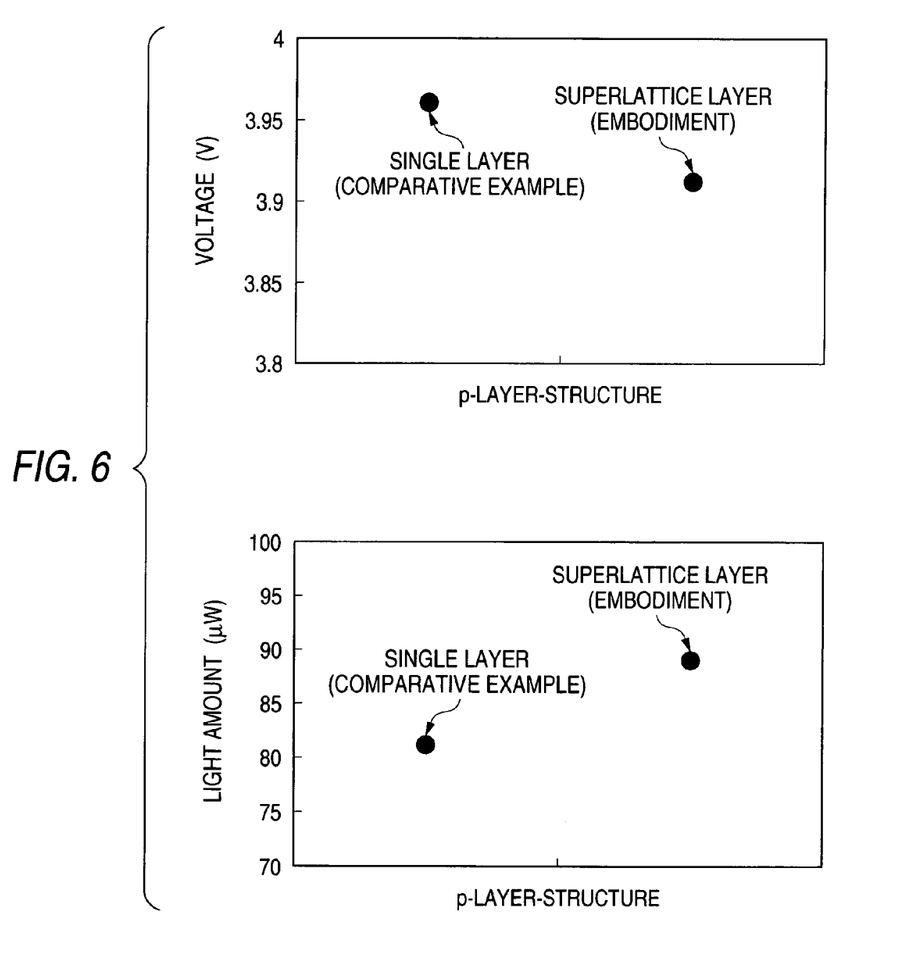
FIG. 6 is a graph comparing the characteristics between the light-emitting diodes according to the embodiment and according to the comparative example.

By comparing the characteristics of the embodiment and the comparative example, the result shown in FIG. 6 was obtained. The upper diagram in FIG. 6 shows driving voltage when applying the electric current of 20 mA in the forward direction in each light-emitting diode. The lower diagram in FIG. 6 shows light output when applying the electric current of 20 mA in the forward direction in each light-emitting diode.

FIG. 6 shows such a result that the light-emitting diode according to the embodiment having a p-type layer with superlattice structure exhibits decrease of the driving voltage and improvement of the light output as compared with the light-emitting diode according to the comparative example having a p-type layer with single layer structure.

The invention is not limited at all to the description of the mode for carrying out the invention and the description of the embodiments. The invention includes various modifications that can be conceived easily by those skilled in the art, without departing from the description of the scope of claim.

The following paragraphs will be disclosed.

21 A method of producing a superlattice structure of a Group III nitride compound semiconductor device, including the purge step of stopping supply of a Group III material gas while sustaining supply of a Group V material gas when each of layers in the superlattice structure is grown by an MOCVD method.

22 A producing method described in the paragraph 21, wherein the Group V material gas is NH$_3$ gas when H$_2$ gas is used as a carrier gas.

23 A producing method described in the paragraph 21 or 22, wherein the p-type layer of the superlattice structure is constituted by an alternate laminate of first layers and second layers.

24 A producing method described in the paragraph 23, wherein each of the first layers is made of AlGaN whereas each of the second layers is made of AlGaN.

25 A producing method described in the paragraph 23, wherein each of the first layers is made of AlGaN:In whereas each of the second layers is made of AlGaN:In.

26 A producing method described in the paragraph 23, wherein each of the first layers is made of AlGaN whereas each of the second layers is made of AlGaN:In 27 A producing method described in the paragraph 25 or 26, wherein the amount of the In to be added into the Group III element is in a range of from $10^{16}$ to $10^{22}$/cm$^3$.

20 A producing method described in the paragraph 25 or 26, wherein the amount of the In to be added into the Group III element is in a range of from $10^{17}$ to $10^{20}$/cm$^3$.

29 A producing method described in the paragraph 25 or 26, wherein the amount of the In material gas in the Group III material gas is in a range of from 5 to 50% by volume.

30 A producing method described in any one of the paragraphs 23 through 29, wherein the thickness of each of the first and second layers is not larger than 18 nm.

31 A producing method described in any one of the paragraphs 23 through 29, wherein the thickness of each of the first and second layers is in a range of from 5 to 15 nm.

41 A Group III nitride compound semiconductor device including a p-type layer of a superlattice structure, wherein the superlattice structure is obtained by the steps of: growing one semiconductor layer; stopping supply of a Group V material gas while sustaining supply of a carrier gas to a surface of the semiconductor layer to thereby perform a purge; and growing a next semiconductor layer after the purge.

42 A producing method described in the paragraph 41, wherein the Group V material gas is NH$_3$ gas when H$_2$ gas is used as a carrier gas.

43 A producing method described in the paragraph 41 or 42, wherein the p-type layer of the superlattice structure is constituted by an alternate laminate of first layers and second layers.

44 A producing method described in the paragraph 43, wherein each of the first layers is made of AlGaN whereas each of the second layers is made of AlGaN.

45 A producing method described in the paragraph 43, wherein each of the first layers is made of AlGaN:In whereas each of the second layers is made of AlGaN:In.

46 A producing method described in the paragraph 43, wherein each of the first layers is made of AlGaN whereas each of the second layers is made of AlGaN:In.

47 A producing method described in the paragraph 45 or 46, wherein the amount of the In to be added into the Group III element is in a range of from $10^{16}$ to $10^{22}$/cm$^3$.

48 A producing method described in the paragraph 45 or 46, wherein the amount of the In to be added into the Group III element is in a range of from $10^{17}$ to $10^{20}$/cm$^3$.

49 A producing method described in the paragraph 45 or 46, wherein the amount of the In material gas in the Group III material gas is in a range of from 5 to 50% by volume.

50 A producing method described In any one of the paragraphs 43 through 49, wherein the thickness of each of the first and second layers is not larger than 18 nm.

51 A producing method described in any one of the paragraphs 43 through 49, wherein the thickness of each of the first and second layers is in a range of from 5 to 15 nm.

What is claimed is:

1. A Group III nitride compound semiconductor device, comprising:
   a p-type layer having a superlattice structure; and
   a light-emitting layer formed below said p-type layer,
   wherein said p-type layer comprises one of:
     an alternate laminate of first layers comprising AlGaN with an indium dopant and second layers comprising AlGaN with an indium dopant; and
     an alternate laminate of first layers comprising AlGan and second layers comprising AlGan with an indium dopant, and
   wherein said p-type layer comprises a resistivity which is less than 20 Ω·cm.

2. A Group III nitride compound semiconductor device according to claim 1, wherein said indium dopant comprises an amount of said In in a range of from $10^{16}$/cm$^3$ to $10^{22}$/cm$^3$.

3. A Group III nitride compound semiconductor device according to claim 1, wherein said indium dopant comprises an amount of said In in a range of from $10^{17}$/cm$^3$ to $10^{20}$/cm$^3$.

4. A Group III nitride compound semiconductor device according to claim 1, wherein said p-type layer comprises an amount of said In which is at least $10^{16}$/cm$^3$.

5. A Group III nitride compound semiconductor device according to claim 1, wherein said p-type layer comprises an amount of said In which is at least $10^{17}$/cm$^3$.

6. A Group III nitride compound semiconductor device according to claim 1, wherein said p-type layer comprises an amount of said In which is not greater than $10^{22}$/cm$^3$.

7. A Group III nitride compound semiconductor device according to claim 1, wherein said p-type layer comprises an amount of said In which is not greater than $10^{23}$/cm$^3$.

8. A Group III nitride compound semiconductor device according to claim 1, wherein a thickness of each of said first and second layers is not greater than 18 nm.

9. A Group III nitride compound semiconductor device according to claim 1, wherein a thickness of each of said first and second layers is in a range of from 5 nm to 15 nm.

10. A Group III nitride compound semiconductor device according to claim 1, further comprising:
    another p-type layer formed between said light-emitting layer and said p-type layer.

11. A Group III nitride compound semiconductor device according to claim 10, wherein said light-emitting layer comprises a superlattice structure.

12. A Group III nitride compound semiconductor device according to claim 10, further comprising:
    an n-type GaN layer formed adjacent to said light-emitting layer; and
    an n-type electrode formed on said n-type GaN layer.

13. A Group III nitride compound semiconductor device according to claim 10, wherein said another p-type layer comprises one of GaN, AlGaN, InGaN and InAlGaN, and is doped with one of Mg, Zn, Be, Ca, Sr and Ba.

14. A Group III nitride compound semiconductor device according to claim 10, wherein said another p-type layer comprises a p$^+$ layer and a p$^-$ layer.

15. A Group III nitride compound semiconductor device according to claim 1, wherein said p-type layer comprises an alternate laminate of first layers comprising AlGan and second layers comprising AlGaN with an indium dopant, and wherein said p-type layer comprises a resistivity which is less than 10 Ω·cm.

16. A Group III nitride compound semiconductor device according to claim 1, wherein said p-type layer comprises an alternate laminate of first layers comprising AlGaN with an indium dopant and second layers comprising AlGaN with an indium dopant.

17. A Group III nitride compound semiconductor device according to claim 1, further comprising:

a light-transmissive electrode formed on said p-type layer having said superlattice structure.

18. A Group III nitride compound semiconductor device according to claim 1, wherein said Group III nitride compound semiconductor device comprises a light-emitting diode.

19. A Group III nitride compound semiconductor device according to claim 1, wherein said light-emitting layer comprises a quantum well structure.

20. A Group III nitride compound semiconductor device according to claim 1, wherein said light-emitting layer comprises a group III nitride compound semiconductor layer doped with an acceptor impurity.

21. A Group III nitride compound semiconductor device according to claim 1, wherein said indium dopant is for reducing an electrical resistivity of said p-type layer.

22. A Group III nitride compound semiconductor device according to claim 21, wherein said indium dopant comprises an indium concentration which is no greater than $10^{23}/cm^3$.

* * * * *